US008174290B2

(12) United States Patent
Higuchi

(10) Patent No.: US 8,174,290 B2
(45) Date of Patent: May 8, 2012

(54) NOISE REDUCTION CIRCUIT AND SEMICONDUCTOR DEVICE PROVIDED WITH NOISE REDUCTION CIRCUIT

(75) Inventor: Yuki Higuchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 9 days.

(21) Appl. No.: 12/912,348

(22) Filed: Oct. 26, 2010

(65) Prior Publication Data

US 2011/0095815 A1 Apr. 28, 2011

(30) Foreign Application Priority Data

Oct. 27, 2009 (JP) ................................ 2009-246308

(51) Int. Cl.
*G01R 29/02* (2006.01)
*H03B 1/00* (2006.01)

(52) U.S. Cl. ......................................... 327/34; 327/551

(58) Field of Classification Search ........................ None
See application file for complete search history.

(56) References Cited

U.S. PATENT DOCUMENTS 7,295,049 B1 * 11/2007 Moyal et al. .................. 327/141
2002/0044000 A1 * 4/2002 Hatanaka ....................... 327/291
2002/0114406 A1 * 8/2002 Mashimo ....................... 375/322
2011/0018622 A1 * 1/2011 Hong ............................ 327/551

FOREIGN PATENT DOCUMENTS

JP 4-330820 A 11/1992

* cited by examiner

*Primary Examiner* — Tuan T Lam
(74) *Attorney, Agent, or Firm* — Sughrue Mion, PLLC

(57) ABSTRACT

A noise reduction circuit includes first and second reset signal generation circuits that generate first and second reset signals that are activated when a data input signal goes to a low level or a high level and are deactivated in synchronization with a clock signal when a high level or a low level is maintained, and first and second counter circuits that count an inverted signal of the clock signal, and are reset by the first or second reset signal. The noise reduction circuit further includes a data output circuit that includes a selector circuit and an output flip-flop circuit that outputs a signal selected by the selector circuit in synchronization with the clock, wherein the selector circuit selects and outputs any of: a signal fixed at a high level or a low level, and an output signal of the output flip-flop circuit, according to logic levels of output signals of the first and second counter circuit.

20 Claims, 12 Drawing Sheets

NOISE REDUCTION CIRCUIT AND SEMICONDUCTOR DEVICE PROVIDED WITH NOISE REDUCTION CIRCUIT

TECHNICAL FIELD

Reference To Related Application

This application is based upon and claims the benefit of the priority of Japanese patent application No. 2009-246308, filed on Oct. 27, 2009, the disclosure of which is incorporated herein in its entirety by reference thereto.

The present invention relates to a noise reduction circuit and a semiconductor device provided with a noise reduction circuit. In particular, the invention relates to a noise reduction circuit that removes noises from an input signal and outputs a shaped waveform without the noises.

BACKGROUND

A charging circuit for a battery, such as a lithium ion battery or the like, is used as one function of a power management IC installed in a mobile device. Recently, in particular, there have been indications of dangers due to explosion or temperature increase in batteries with regard to charging operations. Furthermore, there is a demand for a function for charging a battery rapidly in a short time. From this viewpoint, it is required that the charging circuit and the power management IC that monitors the charging circuit strictly monitor and control states (attachment/detachment, voltage, current, temperature) of the battery and AC adapter that is a charging source.

For the charging circuit of a portable device, a circuit of an analog circuit unit is provided that monitors terminal voltage of a charging adaptor, for example, and detects whether the charging adaptor is attached or detached. If a detection signal sent from this analog circuit unit to a digital circuit unit is processed by the digital circuit unit and the adaptor is connected anew, notification is given that the adaptor is connected on a host side such as another chip or CPU, by outputting an interrupt signal or the like. However, output of the detection signal from the analog circuit unit is unstable in the vicinity of a detection threshold of the signal, and a signal in which a high level and a low level are frequently repeated is outputted to the digital circuit unit at this time. It is difficult to predict in advance a change in level of the signal outputted from this analog circuit unit.

Furthermore, a noise reduction circuit that reduces noise of an input signal is being used conventionally in a digital circuit. The noise reduction circuit of the digital circuit is configured by a multi-bit shift register that operates with a certain constant frequency clock, and generally reduces noise by a unanimous or majority decision of respective stages of the shift register.

Patent Document 1 describes a noise reduction circuit which, in order than circuit size does not increase even when accuracy of noise reduction is raised, uses an up/down counter that operates in synchronization with a clock instead of a shift register, and makes a majority decision as to whether or not the up/down counter has reached a prescribed upper limit or lower limit.

[Patent Document 1]
JP Patent Kokai Publication No. JP-A-4-330820

SUMMARY

The entire disclosure of Patent Document 1 is incorporated herein by reference thereto.

The following analysis is given by the present invention. In order to raise accuracy of noise reduction, it is necessary to increase the frequency of a clock used in a noise reduction circuit. However, in a noise reduction circuit used in a mobile device and the like, if a high frequency clock is used, power consumption increases. Therefore, in a steady state when in standby or the like, operation is often performed with a low frequency clock, and a high frequency clock is not supplied.

Furthermore, in a conventional noise reduction circuit, there is a risk that when noise is inputted in synchronization with a clock, the noise is misread as a signal. Therefore, in a case where only a low frequency clock is supplied, it is also required to reduce noise that is in synchronization with a clock, accurately and with low power consumption.

According to a first aspect of the present invention, there is provided a noise reduction circuit comprising: a first reset signal generation circuit that generates a first reset signal that is activated when a data input signal goes to a low level, and is deactivated in synchronization with a clock signal when the data input signal is maintained at a high level; and a second reset signal generation circuit that generates a second reset signal that is activated when the data input signal goes to a high level, and is deactivated in synchronization with the clock signal when the data input signal is maintained at a low level. The noise reduction circuit further comprises: a first counter circuit that counts an inverted signal of the clock signal and is reset by the first reset signal; and a second counter circuit that counts an inverted signal of the clock signal and is reset by the second reset signal. The noise reduction circuit further comprises a data output circuit that comprises a selector circuit and an output flip-flop circuit that outputs a signal selected by the selector circuit in synchronization with the clock signal, wherein the selector circuit selects and outputs any of: a signal fixed at a high level, a signal fixed at a low level, and the output signal of the output flip-flop circuit, according to logic levels of an output signal of the first counter circuit and an output signal of the second counter circuit.

According to a second aspect of the present invention, there is provided a semiconductor device comprising an analog unit that detects an analog signal and a control logic unit that controls the analog unit formed on a semiconductor substrate. The control logic unit comprises the noise reduction circuit according to the abovementioned first aspect, at an input unit of an analog detection signal outputted by the analog unit.

The meritorious effects of the present invention are summarized as follows.

According to the present invention, in a case where only a low frequency clock is supplied, it is possible to reduce noise with good accuracy and with low power consumption in synchronization with the clock.

PREFERRED MODES

Figure 1:
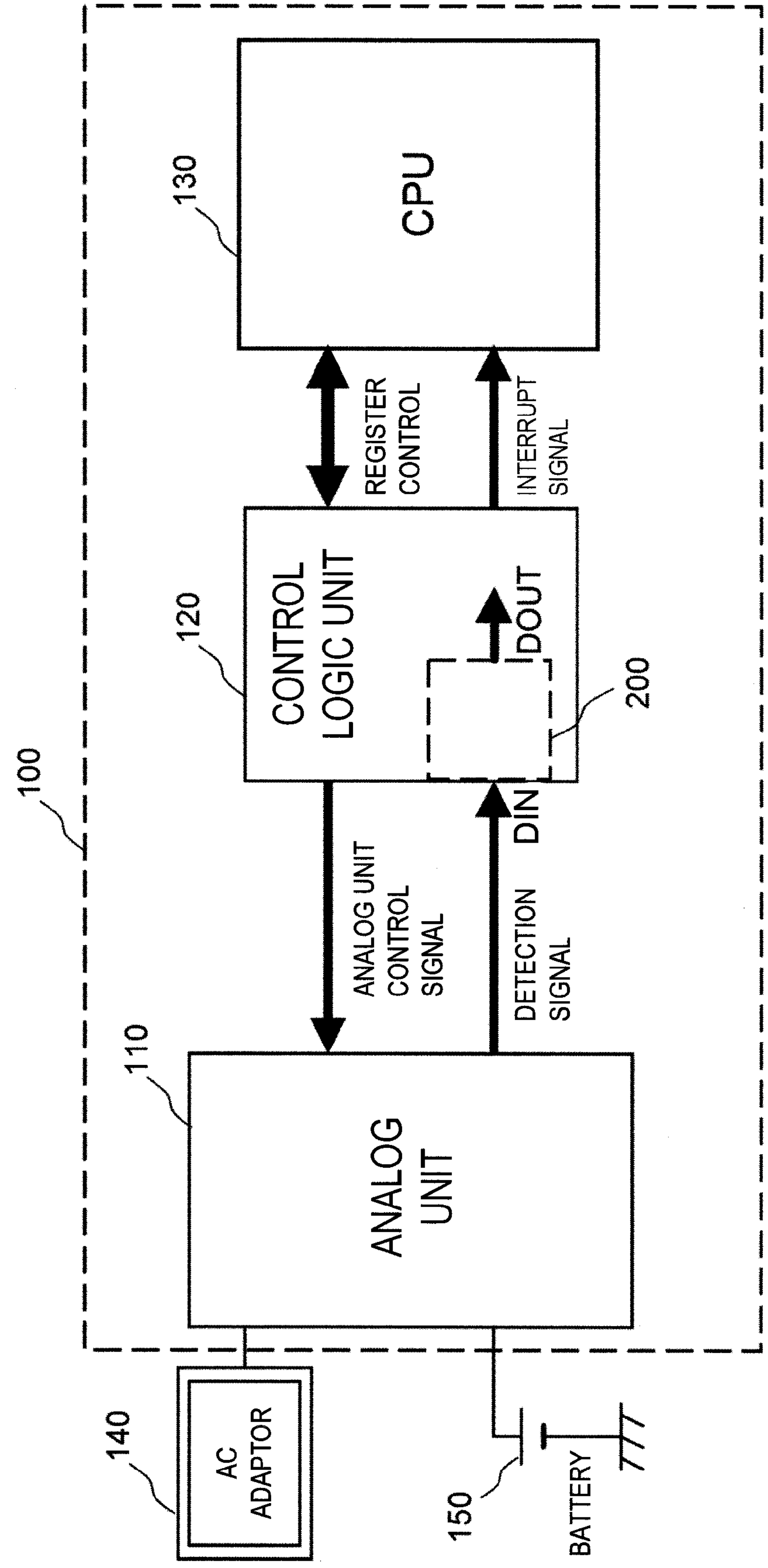
FIG. 1 is a drawing showing an overall configuration of a semiconductor device according to a first exemplary embodiment of the present invention.

First, a description is given of an outline of exemplary embodiments of the present invention. It is to be noted that drawings and reference numerals cited in the description of the exemplary embodiments indicate examples of the exemplary embodiments, and are not thereby intended to limit variations of the exemplary embodiments according to the present invention.

Figure 2:
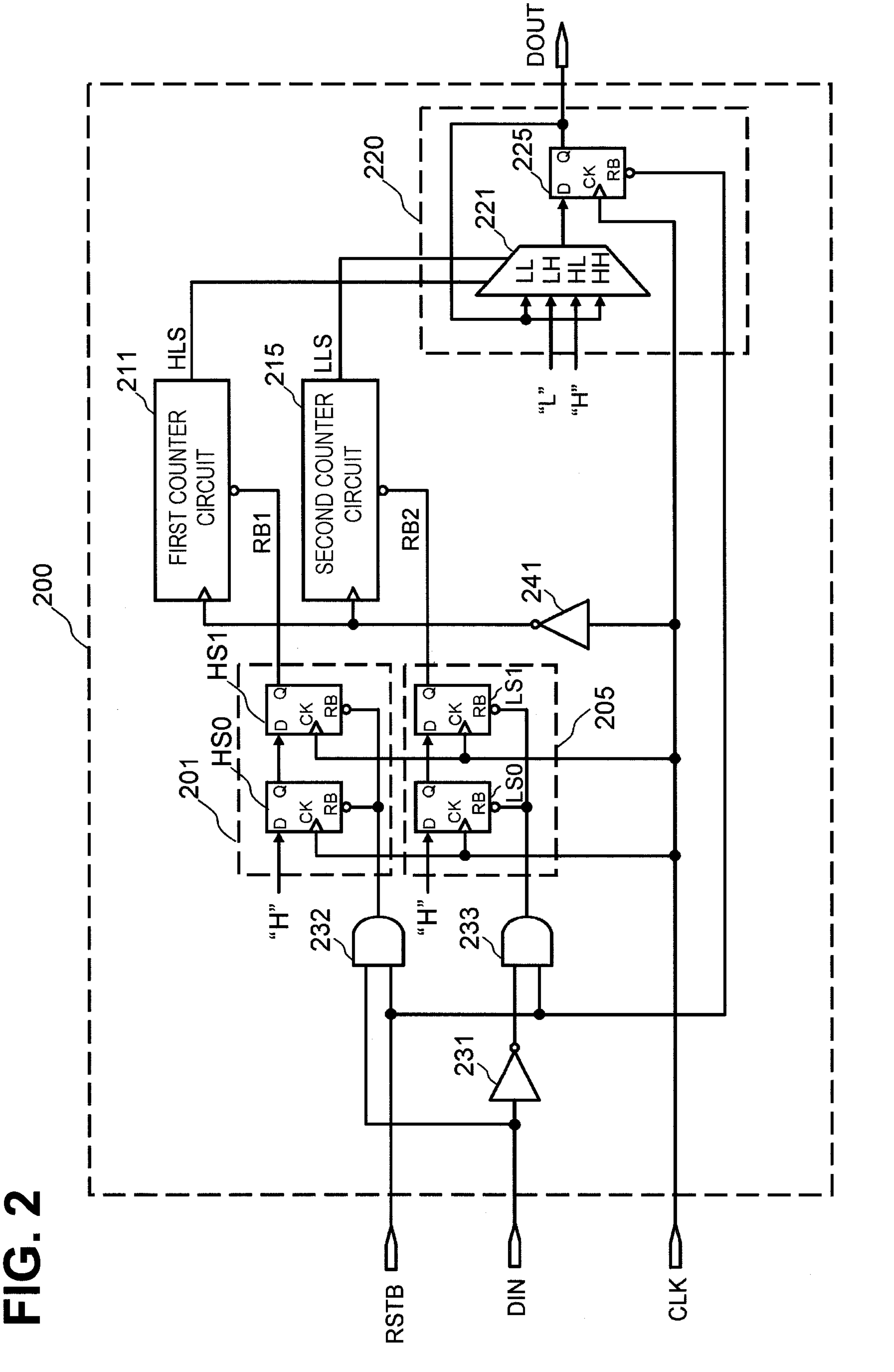
FIG. 2 is a block diagram showing an overall configuration of a noise reduction circuit according to the first exemplary embodiment of the present invention.

As an example, as shown in FIG. 2, a noise reduction circuit 200 of a first embodiment of the present invention is provided with: a first reset signal generation circuit 201 that generates a first reset signal RB1 that is activated when a data input signal DIN has a low level, and is deactivated in synchronization with a clock signal CLK when the data input signal DIN is maintained at a high level; and a second reset signal generation circuit 205 that generates a second reset signal RB2 that is activated when the data input signal DIN has a high level, and is deactivated in synchronization with a clock signal CLK when the data input signal DIN is maintained at a low level. Furthermore, the noise reduction circuit 200 is provided with a first counter circuit 211 that counts inverted signals of the clock signal CLK and is reset by the first reset signal RB1, and a second counter circuit 215 that counts inverted signals of the clock signal CLK and is reset by the second reset signal RB2. In addition, the noise reduction circuit 200 is provided with a data output circuit 220 that includes: a selector circuit 221 and an output flip-flop circuit 225 that outputs signals selected by the selector circuit 221 in synchronization with the clock signal CLK, wherein the selector circuit 221 selects one of any of a signal "H" fixed at a high level, a signal "L" fixed at a low level, and an output signal DOUT of the output flip-flop circuit, by logic levels of an output signal HLS of the first counter circuit 211 and an output signal LLS of the second counter circuit 215, to be outputted.

Furthermore, when the logic levels of the output signals HLS and LLS of the first and second counter circuits 221 and 215 are different, the selector circuit 221 can select and output the signal "H", which is fixed at a high level, or the signal "L", which is fixed at a low level, according to the logic levels thereof, and when output signals of the first and the second counter circuits 211 and 215 are both at reset levels, can select and output the output signal DOUT of the output flip-flop circuit 225.

Figure 4A:
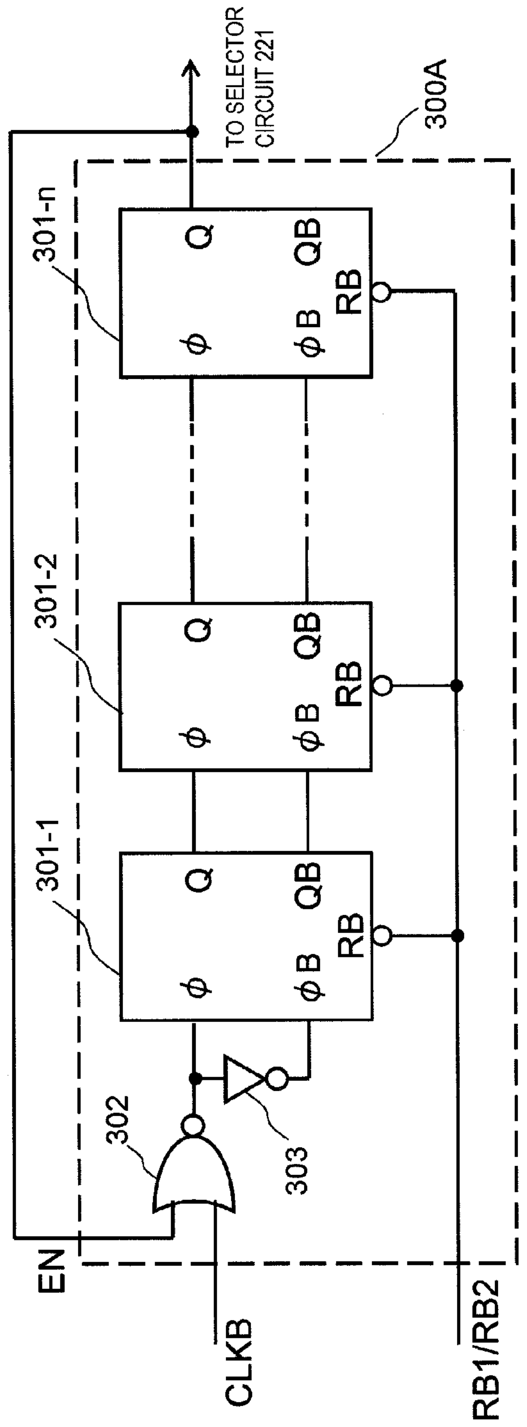
FIG. 4A is a circuit diagram showing an internal configuration of the first and second counter circuits in the first exemplary embodiment.
Figure 9:
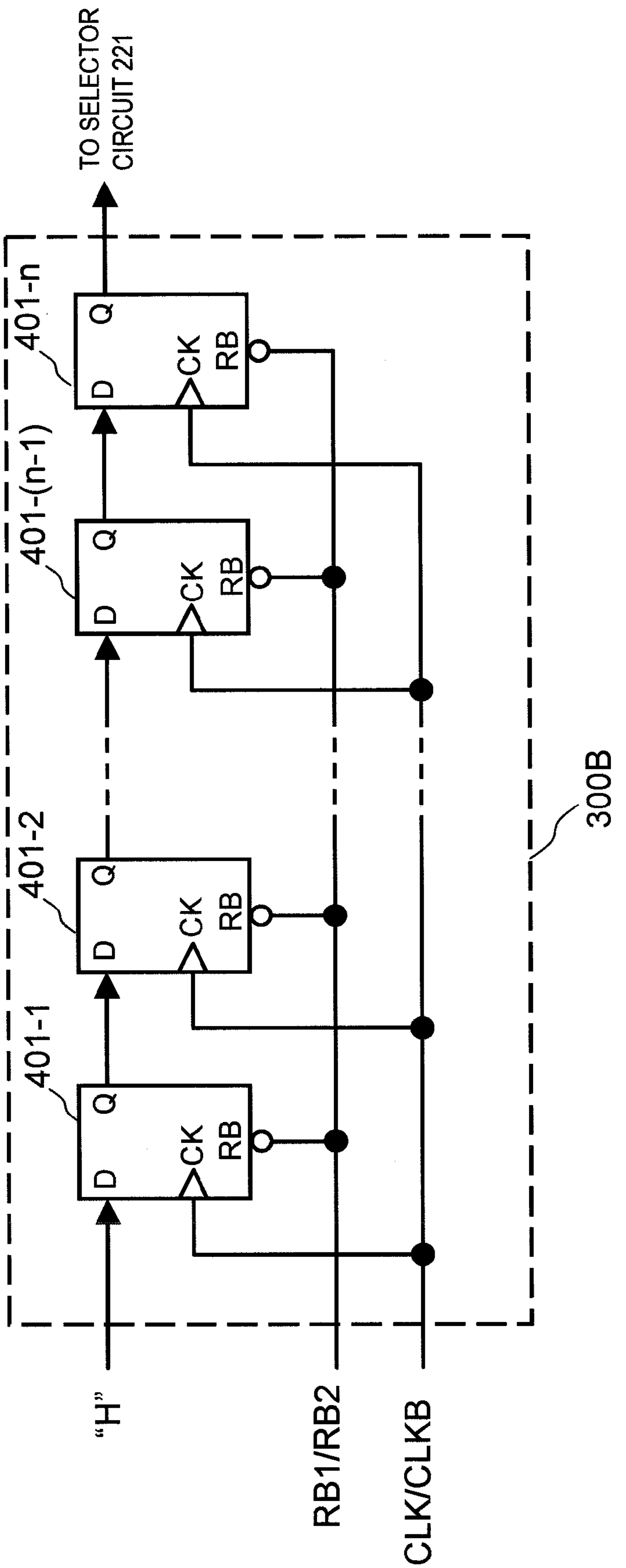
FIG. 9 is a block diagram of a first and a second counter circuit in a second exemplary embodiment.

Furthermore, when the output signals HLS and LLS are set, the first and second counter circuits 211 and 251 can stop count operations. To show an example, when a counter circuit described in FIG. 4A or FIG. 9 is used as the first and second counter circuit, if the output signals HLS and LLS are set (logic that is the inverse of resetting by a reset signal; high level), the output signals HLS and LLS are not inverted as long as resetting is not carried out. The same applies also to counter circuits of FIG. 10 and FIG. 11.

Furthermore, as shown in an example of FIG. 2, it is possible to further include an initialization circuit (232, 233, RSTB wiring) that, when an initializing signal RSTB is received, resets the first and second reset signal generation circuits 201 and 205 so as to output first and second reset signals RB1 and RB2, and resets the output flip-flop circuit 225.

Furthermore, as shown in the example of FIG. 4, the first and second counter circuits 211 and 215 can be a binary flip-flop circuit 301 that is cascade-connected in at least one stage. The binary flip-flop circuit 301 may have at least one stage, and noise detection time can be lengthened by having a cascade connection in a plurality of stages.

Figure 11:
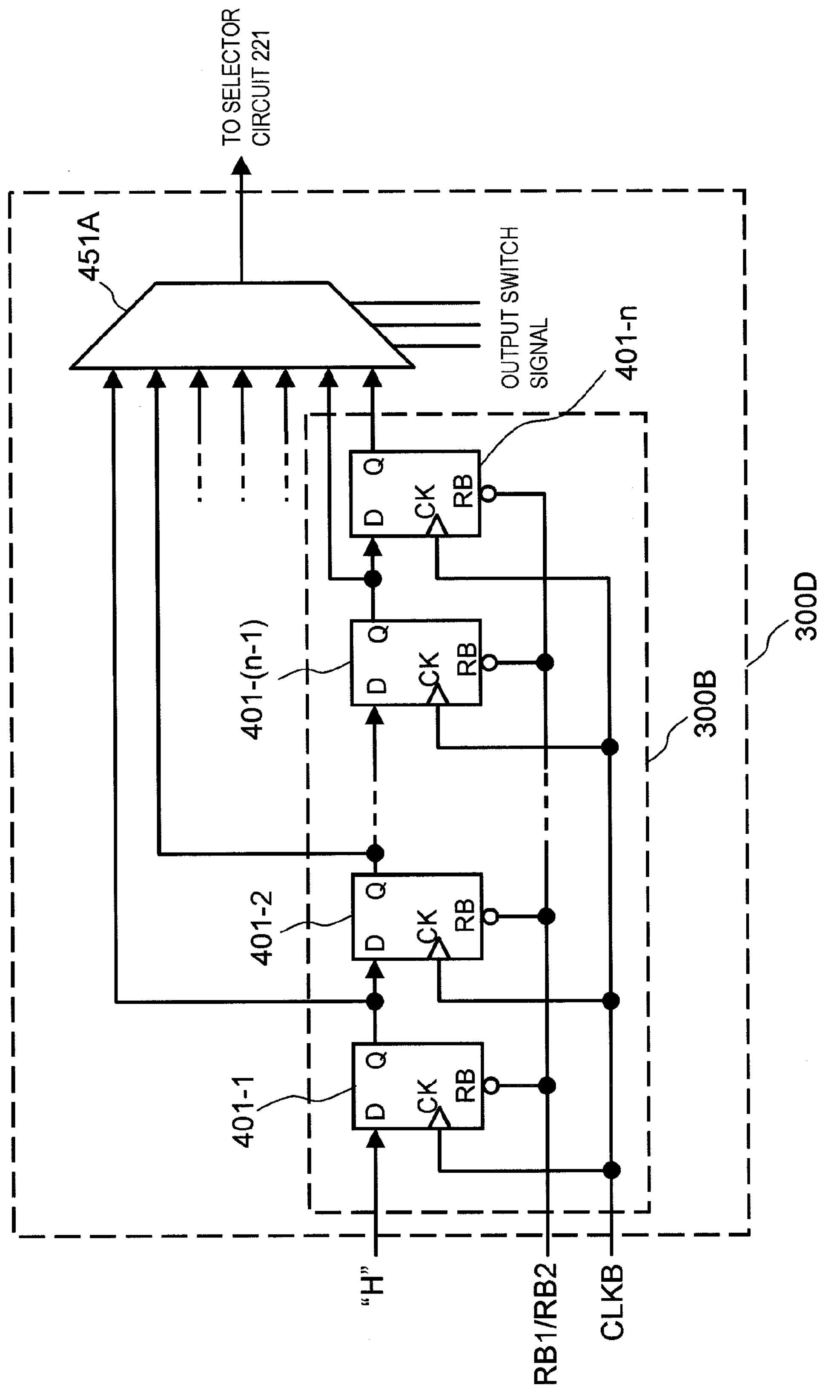
FIG. 11 is a block diagram of a first and a second counter circuit in a fourth exemplary embodiment.

Furthermore, as shown in examples of FIG. 9 and FIG. 11, the first and second counter circuits 211 and 215 can be configured by a shift register circuit that is cascade-connected in at least one stage, wherein first stage input (D input of 401-1) is connected to a set signal "H" (a potential fixed at a high level). The shift register may have at least one stage. Noise detection time can be lengthened by having a cascade connection in a plurality of stages.

Figure 10:
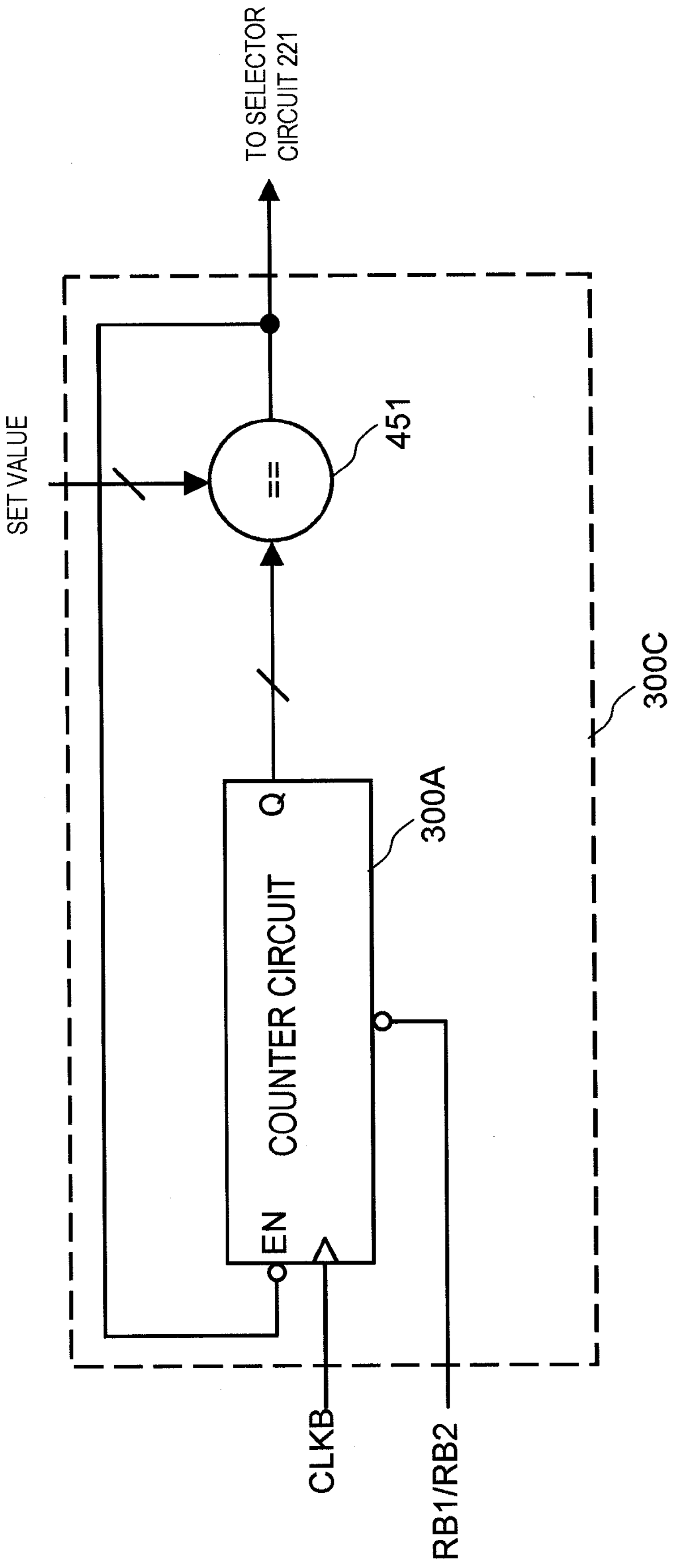
FIG. 10 is a block diagram of a first and a second counter circuit in a third exemplary embodiment.

In addition, as shown in examples of FIG. 10 and FIG. 11, it is possible to program the count of the number of clocks from when the first and second counter circuits 211 and 215 are reset until the output signals HLS and LLS of the counter circuits 211 and 215 are set. By changing a set value of FIG. 10 or an output switching signal (set value) of FIG. 11, it is possible to freely change the number of clocks until the output signals HLS and LLS are set.

Furthermore, either of the first and second counter circuits can be a one-stage counter circuit, wherein, when one inverted signal of the clock signal is counted, an output signal is set.

Furthermore, as shown in FIG. 1 as an example, a semiconductor device 100 in an embodiment of the present invention has an analog unit 110 that detects an analog signal and a control logic unit 120 that controls the analog unit 110, formed on a semiconductor substrate, and the control logic unit 120 is provided with the abovementioned noise reduction circuit 200 at an input unit of an analog detection signal outputted by the analog unit 110.

The outline description is completed as above, and a more detailed description is given below concerning exemplary embodiments, making reference to the drawings.

First Exemplary Embodiment

FIG. 1 is a block diagram showing an overall configuration of a semiconductor device 100 of a first exemplary embodiment. In FIG. 1, the semiconductor device 100 is provided with functions of monitoring a power supply voltage of a battery 150 used in a mobile device or the like, and also of connecting with an AC adapter 140, and charging the battery 150. Furthermore, this semiconductor device 100 is provided with an analog unit 110 that connects the AC adapter 140 and the battery 150, and directly controls monitoring of the power supply voltage of the battery 150 and providing a charge from the AC adapter 140 to the battery 150, and a control logic unit 120 that outputs an analog unit control signal to the analog unit 110 and receives as input a detection signal of a state of the AC adapter 140 and the battery 150 outputted by the analog unit 110. The analog unit 110 and the control logic unit 120 are formed on the same semiconductor substrate of the same semiconductor chip. Furthermore, the control logic unit 120 is connected to a CPU 130 or another semiconductor chip; a register included in the control logic unit is controlled by the CPU 130 or the other semiconductor chip, and information included in the register is outputted to the CPU 130 or the other semiconductor chip. Furthermore, the control logic unit 120 receives a detection signal outputted by the analog unit 110 as an input signal DIN, and outputs an interrupt signal to the CPU 130 or the other semiconductor chip.

In the control logic unit 120 there is provided a noise reduction circuit 200 that receives the data input signal DIN, which is the detection signal outputted by the analog unit 110, and that reduces noise from the data input signal DIN. The noise reduction circuit 200 outputs a signal obtained by reducing noise in the detection signal, as a data output signal DOUT. The control logic unit 120 outputs an interrupt signal to the CPU 130 or to an external semiconductor chip, based on the data output signal DOUT of the noise reduction circuit 200. It is to be noted that in FIG. 1 the CPU 130 is included inside the semiconductor device 100, but the CPU 130 may relate to a semiconductor chip separate from the analog unit 110 and the control logic unit 120.

FIG. 2 is a block diagram showing an overall configuration of the noise reduction circuit 200. The noise reduction circuit 200 reduces noise from the data input signal DIN, and outputs the data output signal DOUT synchronized with a clock signal CLK, as a signal in which noise has been reduced. An initialization signal RSTB that initializes the entire of the noise reduction circuit 200 is supplied to the noise reduction circuit 200.

The noise reduction circuit 200 is provided with a first reset signal generation circuit 201 that generates a first reset signal RB1 that is activated when the data input signal DIN has a low level, and is deactivated in synchronization with a clock signal CLK when the data input signal DIN is maintained at a high level. Therefore, when the data input signal DIN has a low level, the first reset signal RB1 is activated asynchronously with the clock signal CLK, and when the data output signal DIN is maintained at a high level for a fixed time-period in synchronization with the clock signal CLK, this activated first reset signal RB1 is deactivated in synchronization with the clock signal CLK.

Furthermore, the noise reduction circuit 200 is provided with a second reset signal generation circuit 205 that generates a second reset signal RB2 that is activated when the data input signal DIN has a high level, and is deactivated in synchronization with a clock signal CLK when the data input signal DIN is maintained at a low level. When the data input signal DIN has a high level, the second reset signal RB2 is activated asynchronously with the clock signal CLK, and when the data output signal DIN is maintained at a low level for a fixed time-period in synchronization with the clock signal CLK, this activated second reset signal RB2 is deactivated in synchronization with the clock signal CLK.

Furthermore, the noise reduction circuit 200 is provided with a first counter circuit 211 that counts inverted signals of the clock signal CLK and is reset by the first reset signal RB1. Furthermore, when the output signal HLS is set, the first counter circuit 211 stops the count operation. That is, the first counter circuit 211 sets the output signal HLS to a high level by the data input signal DIN being maintained at a high level of a fixed period or longer, of the clock signal CLK, and as long as the data input signal DIN is maintained at a high level, the output signal HLS is maintained at a high level. However, if the data input signal DIN goes to a low level even for a moment, the output signal HLS is reset by the first reset signal RB1 asynchronously with the clock signal CLK.

Furthermore, the noise reduction circuit 200 is provided with a second counter circuit 215 that counts inverted signals of the clock signal CLK and is reset by the second reset signal RB2. Furthermore, when the output signal LLS is set, the second counter circuit 215 stops the count operation. That is, the second counter circuit 215 sets the output signal LLS to a high level by the data input signal DIN being maintained at a low level of a fixed period or longer, of a clock signal CLK, and as long as the data input signal DIN is maintained at a low level, the output signal LLS is maintained at a high level. However, if the data input signal DIN goes to a high level even for a moment, the output signal LLS is reset by the second reset signal RB2 asynchronously with the clock signal CLK.

In addition, the noise reduction circuit 200 is provided with a data output circuit 220. The data output circuit 220 is provided with a selector circuit 221 that determines a logic level of a signal to be outputted, based on the high level set signal HLS, which is an output signal of the first counter circuit 211, and the low level set signal LLS, which is an output signal of the second counter circuit 215, and an output flip-flop circuit 225 that outputs a signal selected by the selector circuit 221 as the data output signal DOUT in synchronization with the clock signal CLK.

When the high level set signal HLS is at a low level, and the low level set signal LLS is at a high level, the selector circuit 221 selects and outputs a signal “L” that is fixed at a low level, and when the high level set signal HLS is at a high level, and the low level set signal LLS is at a low level, the selector circuit 221 selects and outputs a signal “H” that is fixed at a high level. Furthermore, when the high level set signal HLS and the low level set signal LLS are both at a low level or are both at a high level, an output signal DOUT of the output flip-flop circuit 225 is selected and outputted. The output flip-flop circuit 225 outputs the signal selected by the selector circuit 221 as the data output signal DOUT in synchronization with a rise edge of the clock signal CLK. The first counter circuit 211 and the second counter circuit 215 both operate in synchronization with a fall edge of the clock signal CLK, and when the data input signal DIN level changes along the way, the first counter circuit 211 and the second counter circuit 215 may be reset asynchronously with the clock. However, with regard to the output flip-flop circuit 225, since the output signal level is selected by the selector circuit 221 provided in a previous stage, and the data output signal DOUT is outputted by the output flip-flop circuit 225 in synchronization with the clock signal, no what matter timing the data input signal DIN changes at, it is possible to output the data output signal DOUT as a signal with noise reduced, in synchronization with the clock signal CLK.

It is to be noted that if the high level set signal HLS and the low level set signal LLS do not have a high level at the same time, in the selector circuit 221, logic may be omitted for selecting an output signal of the output flip-flop circuit 225 for when the high level set signal HLS and the low level set signal LLS have a high level at the same time.

Furthermore, when the initialization signal RSTB is activated at a low level, the noise reduction circuit 200 resets the first reset signal generation circuit 201 and the second reset signal generation circuit 205, and resets the output flip-flop circuit 225. It is possible to reset the whole of the noise reduction circuit 200 by the initialization signal RSTB.

Figure 3:
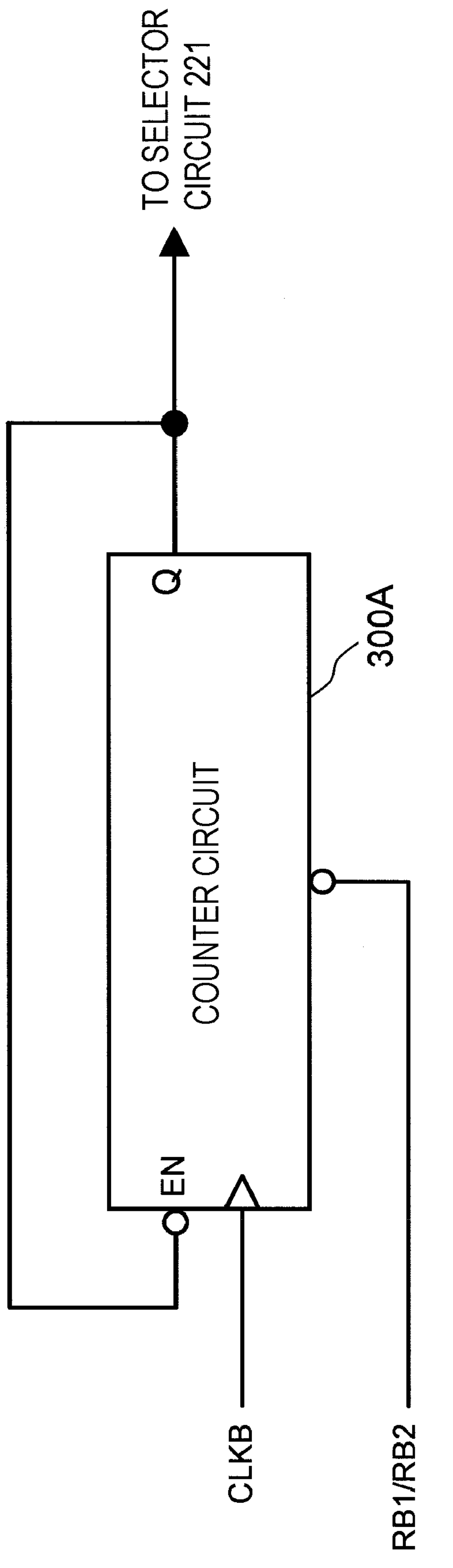
FIG. 3 is a block diagram of a first and a second counter circuit in the first exemplary embodiment.

FIG. 3 is a block diagram of the first and second counter circuits 211 and 215. The first and second counter circuits 211 and 215 are configured by an arbitrary-bit counter circuit 300A. An output signal of the counter circuit 300A is connected to the selector circuit 221 and also is connected to an enable terminal EN of the counter circuit 300A. The counter circuit 300A stops a count operation when an output signal Q is set, by the enable terminal EN. Furthermore, the first reset signal RB1 or the second reset signal RB2 are connected to the counter circuit 300A, and resetting is performed when the reset signals RB1 and RB2 go to a low level.

FIG. 4A is a circuit diagram showing a further internal configuration of the counter circuit 300A. The counter circuit 300A is configured by n cascade-connected binary flip-flop circuits (301-1 to 301-n) (n is a natural number). With regard to the n binary flip-flop circuits (301-1 to 301-n), non-inverted and inverted output signals Q and QB of the binary flip-flop circuit of a previous stage are connected as a non-inverted clock signal and an inverted clock signal of a subsequent stage, and a non-inverted output signal of the final stage 301-n is connected to the selector circuit 221 as a high level set signal HLS or a low level set signal LLS. Furthermore, the non-inverted output signal of the final stage 301-n is connected to a NOR circuit 302 as an enable signal. An inverted clock signal CLKB is connected to another input terminal of the NOR circuit 302, and an output signal of the NOR circuit 302 is connected as a non-inverted clock signal of the binary flip-flop circuit 301-1 of the first stage. The counter circuit 300A counts in synchronization with a rise edge of the inverted clock signal CLKB (or a fall edge of the non-inverted clock signal CLK), and stops the count operation when the output signal Q of the final stage is set.

Figure 4B:
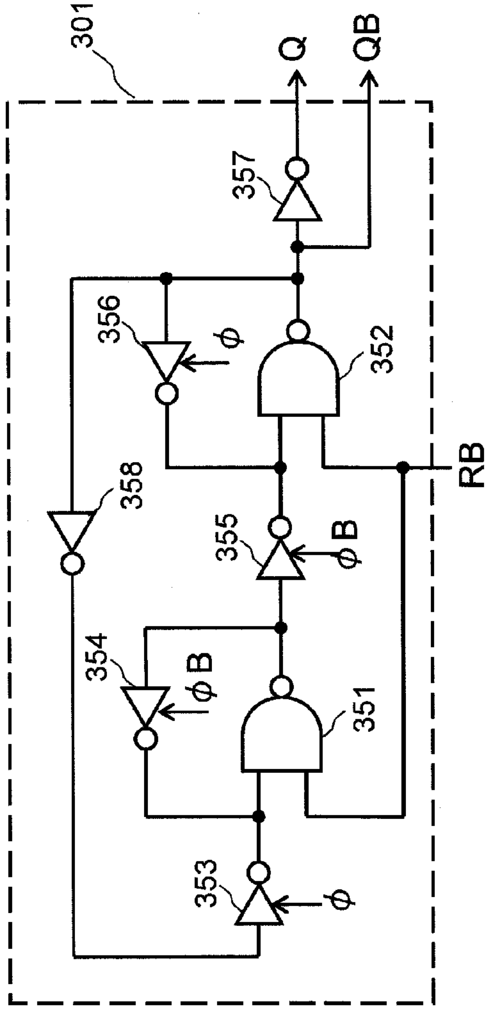
FIG. 4B is a circuit diagram of a binary flip-flop circuit that can be used in the first and second counter circuits.

Furthermore, for the binary flip-flop circuits (301-1 to 301-n) used in the counter circuit 300A, a well known CMOS binary flip-flop circuit 301 as shown in FIG. 4B can be used. The CMOS binary flip-flop circuit 301 is configured by including reset NAND circuits 351 and 352, clocked inverters 353 to 356, and inverters 357 and 358.

Figure 5:
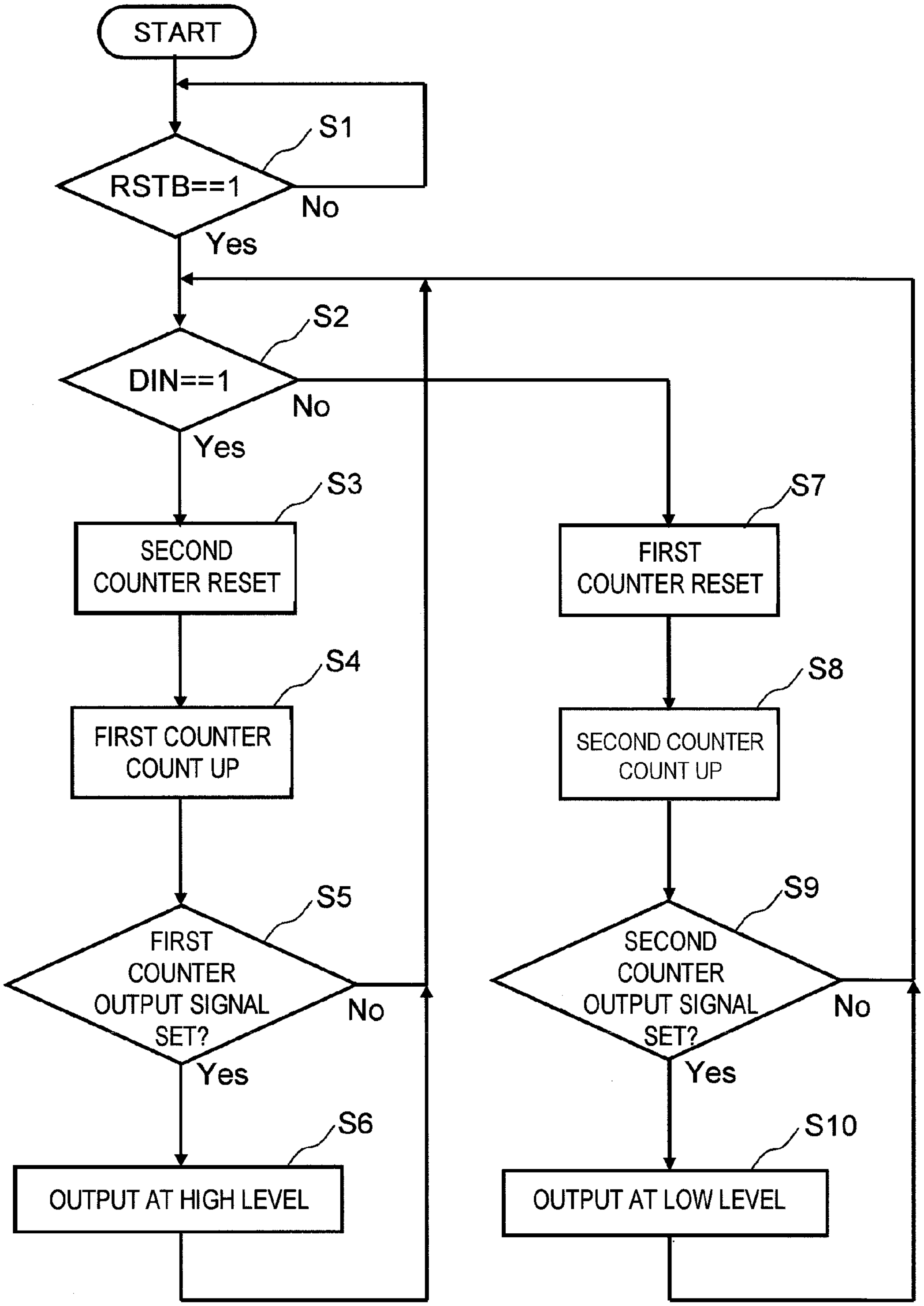
FIG. 5 is a flow diagram showing an outline operation of the noise reduction circuit in the first exemplary embodiment.

Next, a description is given concerning operation of the noise reduction circuit 200 of the first exemplary embodiment. FIG. 5 is an operation flowchart describing an outline operation of the noise reduction circuit 200 of FIG. 2. At the start of processing, the initialization signal RSTB is at a low level, and the whole noise reduction circuit 200 is initialized by the initialization signal RSTB. When the initialization signal RSTB is at a low level, the first reset signal generation circuit 201, the second reset signal generation circuit 205, and the output flip-flop circuit 225 are directly reset by the initialization signal RSTB. Furthermore, by the first and second reset signal generation circuits 201 and 205 being reset, the first and second reset signal generation circuits 201 and 205 activate the first and second reset signals RB1 and RB2, and reset the first and second counter circuits 211 and 215.

Next, in step S1, monitoring is performed whether or not the initialization signal RSTB goes to a high level and a reset state is deactivated. When the initialization signal RSTB remains at a low level, a reset state is maintained until the initialization signal RSTB goes to a high level. When the initialization signal RSTB goes to a high level, the reset state is deactivated, and control progress to step S2. In step S2, operation differs according to whether the data input signal DIN is at a high level or at a low level. When the data input signal DIN is at a high level, the second counter circuit 215 is reset (step S3), and a count-up is performed in the first counter circuit 211 in synchronization with the clock signal CLK (step S4). In a subsequent step S5, a logic level of the high level set signal HLS, which is an output signal of the first counter circuit 211, is monitored, and when the high level set signal HLS is not at a high level, control returns to step S2 and operation is continued. In a case where the high level set signal HLS is set to a high level, control progresses to step S6, output is performed at a high level by the data output signal DOUT, and control returns to step S2.

In step S2, when the data input signal DIN is at a low level, the first counter circuit 211 is reset (step S7), and a count-up is performed in the second counter circuit 215 in synchronization with the clock signal CLK (step S8). In a subsequent step S9, a logic level of the low level set signal LLS, which is an output signal of the second counter circuit 215, is monitored, and when the low level set signal LLS is not at a high level, control returns to step S2 and operation is continued. In a case where the low level set signal LLS is set to a high level, control progresses to step S10, output is performed at a low level by the data output signal DOUT, and control returns to step S2. In this way, operation continues as long as the initialization signal RSTB does not again have a low level. In a case where the initialization signal RSTB is at a low level, control returns to the “start” of this operation flowchart, and initial setting is re-done.

Figure 6:
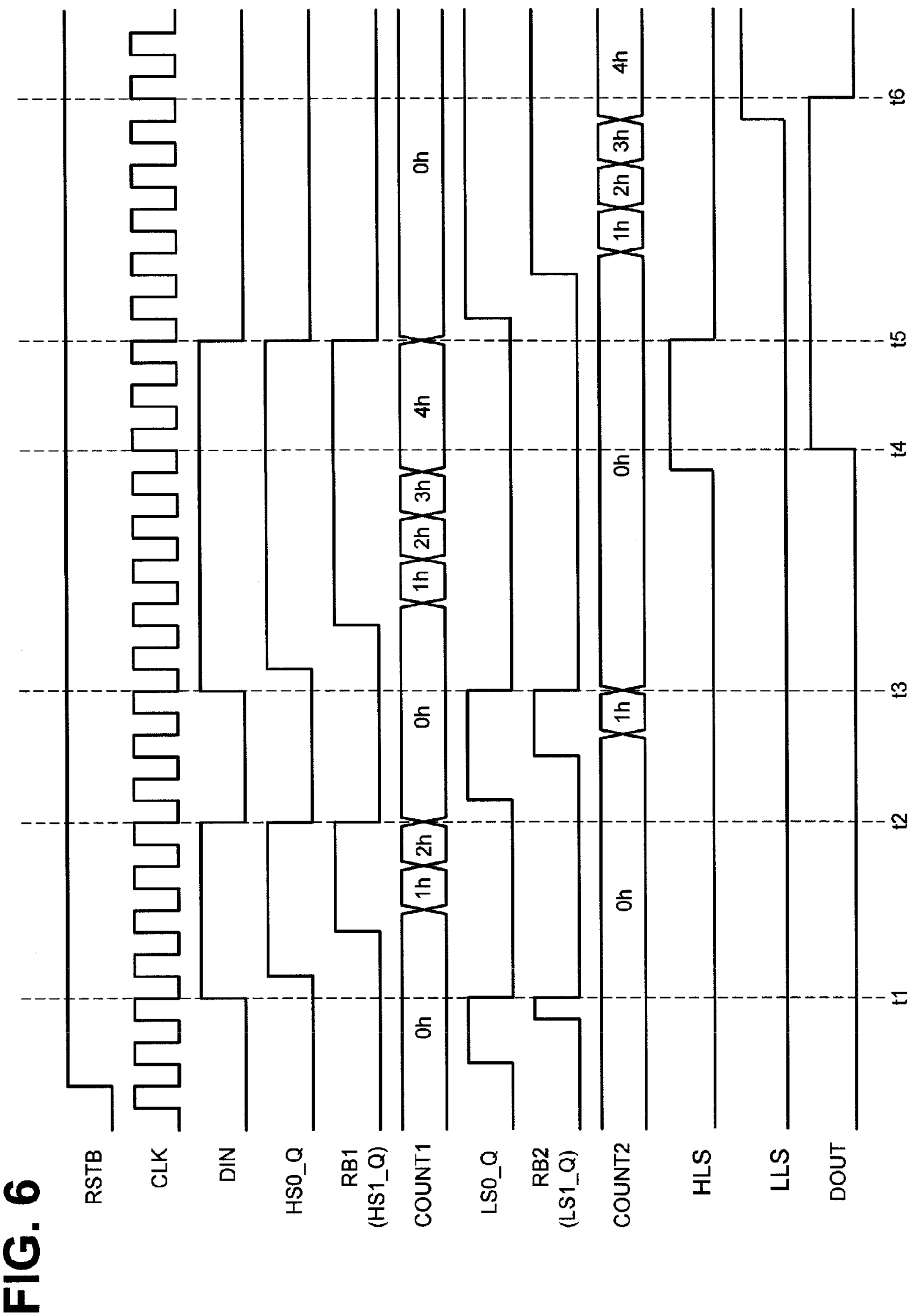
FIG. 6 is an operation timing diagram showing a detailed operation of the noise reduction circuit in the first exemplary embodiment.

FIG. 6 is an operation timing diagram showing detailed operation of the noise reduction circuit of the first exemplary embodiment. A more detailed description is given concerning operation of the noise reduction circuit of the first exemplary embodiment, using FIG. 6. It is to be noted that the operation timing diagram of FIG. 6 is of a case where the first and second counter circuits 211 and 215 of FIG. 2 are both configured by three stage binary flip-flop circuits. That is, this is a case where n=3 in a configuration of FIG. 4A. Therefore, the first and second counter circuits 211 and 215 both count up as far as 4 h (“4 h” indicates that a number 4 is hexadecimal, ending with “h”), set the output signals HLS and LLS, and stop the count operation.

First, when the initialization signal RSTB is at a low level at the start, the whole noise reduction circuit 200 is reset, data flip-flop circuits HS0 and HS1 for high level synchronization included in the first reset signal generation circuit 201, data flip-flop circuits LS0 and LS1 for low level synchronization included in the second reset signal generation circuit 205, and the output flip-flop circuit 225 are all reset, and HS0_Q, RB1 (HS1_Q), LS0_Q, RB2 (LS1_Q), and DOUT are all given an initial setting to a low level. Furthermore, by the first and second reset signals RB1 and RB2 each being at a low level, COUNT1 and COUNT2 of FIG. 6, which are count values of the first and second counter circuits 211 and 215, are initialized to Oh, and the high level set signal HLS and the low level set signal LLS are also initialized to a low level, respectively.

After the initialization signal RSTB goes to a high level and a reset state is deactivated, the data input signal DIN changes from a low level to a high level at timing t1. Then the second reset signal generation circuit 205 is reset and also a reset signal with respect to the first reset signal generation circuit 201 is deactivated. At a subsequent clock signal CLK rise, Q output of the data flip-flop HS0 for high level synchronization goes to a high level. In addition, at a rise of the clock signal CLK after one period of the clock signal CLK, the first reset signal RB1 goes to a high level, and a reset signal with respect to the first counter circuit 211 is deactivated. Since the first counter circuit 211 is a counter circuit that operates in synchronization with a fall of the clock signal CLK, from a fall of the clock signal CLK half a period later, the first counter circuit 211 starts counting up, and counts up at each fall of the clock signal CLK.

However, at timing t2 when the first counter circuit 211 has counted up as far as 2 h, a logic level of the data input signal DIN falls from a high level to a low level. Then, the first reset signal generation circuit 201 is reset, HS0_Q and RB1 go to a low level; the first counter circuit 211 is also reset, and a count value of the first counter circuit 211 (COUNT1 of FIG. 6) is cleared and returns to 0 h.

Next, at timing t3, when the data input signal DIN changes once again from a low level to a high level, at a subsequent clock signal CLK rise, HS0_Q rises to a high level. Furthermore, at a rise of the clock signal CLK one period later, the first reset signal RB1 goes to a high level, and a reset signal with respect to the first counter circuit 211 is deactivated. The first counter circuit 211 starts counting up in synchronization with a fall of the clock signal CLK, and counts up at each fall of the clock signal CLK. When a counter value of the first counter circuit 211 (COUNT1 of FIG. 6) reaches 4 h, the high level set signal HLS rises, the selector circuit 221 selects the signal "H" that is fixed at a high level, and the data input signal of the output flip-flop circuit 225 has a high level. The output flip-flop circuit 225 makes the data output signal DOUT rise from a low level to a high level in synchronization with a subsequent rise of the clock signal CLK (timing t4).

Next, at timing t5, a logic level of the data input terminal DIN is falling from a high level to a low level. Then, the first reset signal generation circuit 201 is reset, HS0_Q and RB1 go to a low level; the first counter circuit 211 is also reset, and a count value COUNT1 is cleared and returns to 0 h. Furthermore, the high level set signal HLS also returns to a low level. Then the selector circuit 221 switches an input data selection from the signal "H" that is fixed at a high level, to an output signal DOUT of the output flip-flop circuit. At this point in time, since the output signal DOUT of the output flip-flop circuit is also at a high level, the logic level of the data output signal DOUT is maintained at a high level even if the input data selection is changed by the selector circuit 221.

Furthermore, at timing t5, when the data input signal DIN falls the reset state of the second reset signal generation circuit 205 is deactivated, and at a subsequent rise of the clock signal CLK, LS0_Q rises to a high level. In addition, at a rise of the clock signal CLK one period later, the second reset signal RB2 goes to a high level, and a reset signal with respect to the second counter circuit 215 is deactivated. The second counter circuit 215 starts counting up in synchronization with a fall of the clock signal CLK, and counts up at each fall of the clock signal CLK. When the count value of the second counter circuit 215 (COUNT2) reaches 4 h, the low level set signal LLS rises, the selector circuit 221 selects the signal "L" that is fixed at a low level, and the data input of the output flip-flop circuit 225 changes from a high level to a low level. The output flip-flop circuit 225 makes the data output signal DOUT fall from a high level to a low level in synchronization with a subsequent rise of the clock signal CLK (timing t6).

In this way, the noise reduction circuit 200 can reduce noise by responding only to signals in which logic level change is maintained until output signals of the first and second counter circuits change, by reducing the noise, which is a change of short period, from the data input signal DIN.

In a case where the noise reduction circuit 200 is used in an analog-digital consolidated semiconductor device described in FIG. 1, noise from the clock is easily generated. In an analog circuit a power supply voltage of a certain level (for example, approximately 3V) is necessary in order to ensure a constant characteristic, whereas in a digital circuit, due to transistor miniaturization and lower power consumption, a power supply voltage lower than an analog circuit is used, and this power supply voltage is decreasing more and more (for example, 1.5V or less). Therefore, due to the power supply systems of analog circuits and digital circuits being different, and the power supply voltage of digital circuits decreasing, a digital circuit that receives an output signal of an analog circuit is easily affected by noise.

Figure 7:
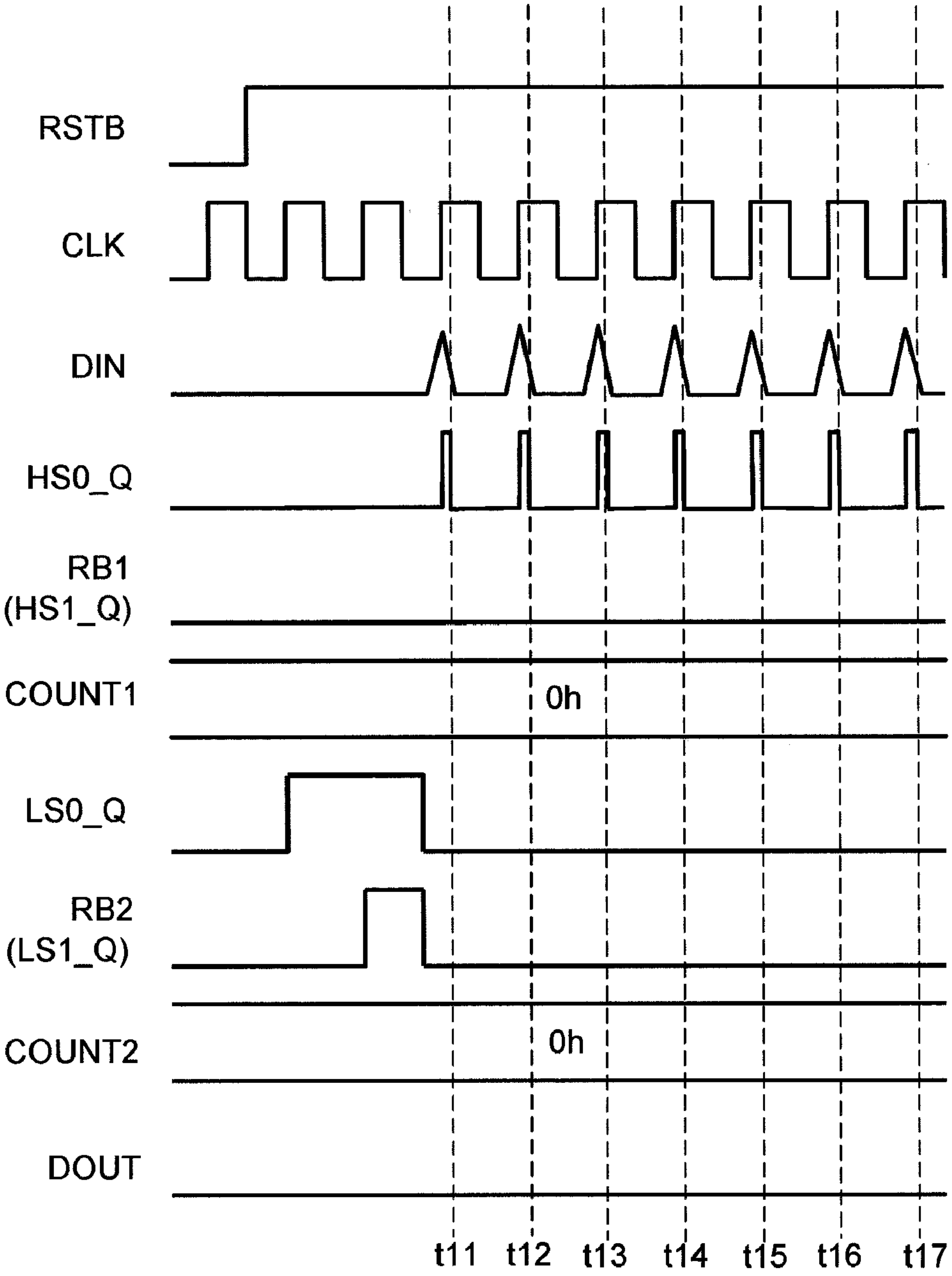
FIG. 7 is an operation timing diagram when noise is inputted in synchronization with a clock in the first exemplary embodiment.

FIG. 7 is an operation timing diagram of a case where noise is inputted in synchronization with the clock signal CLK, in the noise reduction circuit 200 of the first exemplary embodiment. FIG. 7 shows operation in a case where, irrespective of the fact that a conventional data input signal DIN is maintained at a low level, noise is inputted from the data input terminal DIN in synchronization with a rise of the clock signal CLK. Since noise is inputted from the data input terminal DIN in synchronization with a rise of the clock signal CLK, the output signal HS0_Q of the flip-flop circuit for high level synchronization of a first stage of the first reset signal generation circuit 201 in FIG. 2 reacts to this, and outputs at a high level. However, at the rise of the clock signal CLK, even if a high level of the data input signal DIN and a rise of the clock signal CLK, by chance consecutively, overlap, as long as the high level of the data input signal DIN is not maintained continuously, if the data input signal DIN has a low level even for a moment, the first reset signal generation circuit 201 is reset. When the first reset signal generation circuit 201 is reset, the first counter circuit 211 is also reset thereby. Therefore, even if noise is inputted from the data input signal DIN in synchronization with the clock signal CLK, as long as a level changed by the noise is not maintained for a fixed time-period, there is no malfunction.

Figure 8:
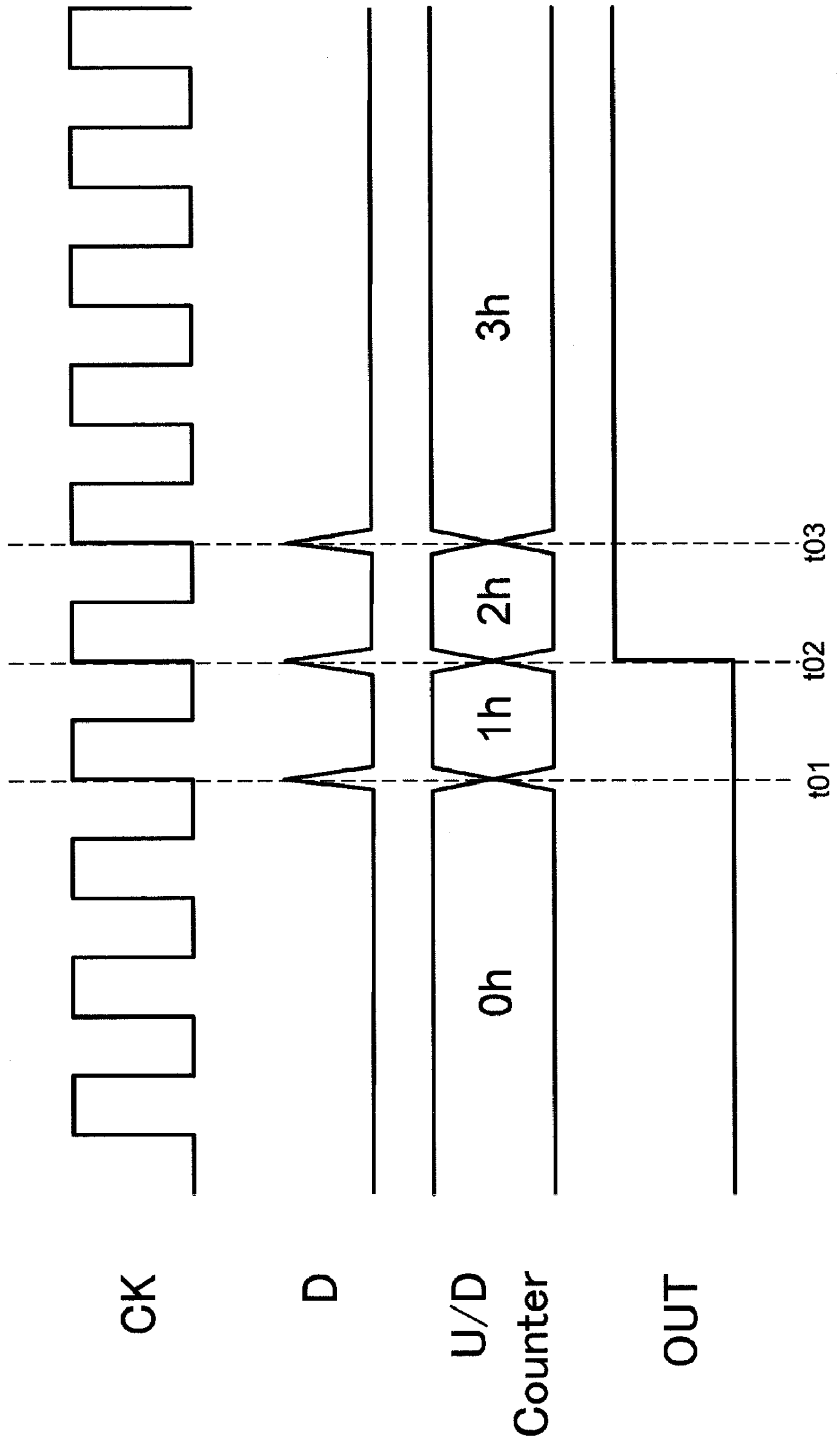
FIG. 8 is an operation timing diagram when noise is inputted in synchronization with a clock in a conventional noise reduction circuit.

In contrast to this, in a conventional noise reduction circuit as in Patent Document 1, for example, there is a risk of a malfunction when noise is inputted in synchronization with the clock signal. FIG. 8 is an operation timing diagram when noise is inputted in synchronization with the clock in a conventional noise reduction circuit as in Patent Document 1. If noise is inputted from an input terminal D in synchronization with a clock CK, an up-down counter circuit makes a count error due to the noise, and when a count value has a fixed value, an output signal OUT reacts to the noise and inverts an output signal.

Second Exemplary Embodiment

The first exemplary embodiment showed an example in which a first counter circuit 211 and a second counter circuit 215 are configured by counter circuits using a binary flip-flop circuit 301 of FIG. 4B. However, the counter circuits 211 and 215 are not limited to using the binary flip-flop circuit 301. For example, both the first counter circuit 211 and the second counter circuit 215 can be configured using a shift register circuit. FIG. 9 is a block diagram of a counter circuit 300B using a shift register that can be used in the first counter circuit 211 and the second counter circuit 215.

The counter circuit 300B of FIG. 9 is configured by a shift register circuit in which a plurality of data flip-flop circuits (401-1 to 401-n) are cascade-connected. Among the cascade-connected plurality of data flip-flop circuits, input of the data flip-flop circuit 401-1 of a first stage is connected to a set signal "H". Each of the data flip-flop circuits (401-1 to 401-n) outputs data inputted from a D terminal, from a Q terminal, when a clock signal CLK falls. Furthermore, a first reset signal RB1 or a second reset signal RB2 is connected as a reset signal to each of the data flip-flop circuits (401-1 to 401-n). It is to be noted that the set signal "H" is fixed at a high level. When the reset signals (RB1 and RB2) are deactivated, the counter circuit 300B counts by shifting input data one stage at a time in synchronization with a fall of the clock signal CLK, and outputs a Q signal of a final stage to a selector circuit 221 of FIG. 2 as a high level set signal HLS or a low level set signal LLS. It is to be noted that if the data flip-flop circuits (401-1 to 401-n) have at least one stage, usage is possible as the counter circuits 211 and 215 making up a noise reduction circuit 200. It is possible to change the number of stages n (n is a natural number) of the data flip-flop circuit in accordance with length of noise to be reduced.

The noise reduction circuit of a second exemplary embodiment is configured using the counter circuit 300B of FIG. 9, with regard to the first and second counter circuits 211 and 215 of the noise reduction circuit 200 of the first exemplary embodiment. Configuration and operation timing are otherwise the same as for the first exemplary embodiment. If the number n of stages of the data flip-flop circuit 401 is taken as 4, an operation timing diagram is identical to FIG. 6 of the first exemplary embodiment.

Third Exemplary Embodiment

A third exemplary embodiment is an example in which, with regard to the first exemplary embodiment, a clock period, up until when a first counter circuit 211 and a second counter circuit 215 set an output signal (high level set signal HLS, low level set signal LLS), is programmable. FIG. 10 is a block diagram of the first counter circuit 211 and the second counter circuit 215 in the third exemplary embodiment. In the third exemplary embodiment, by providing a match detection circuit 451 that compares a set value of Q output (refer to FIG. 4A) of each stage of a counter circuit in the first exemplary embodiment, and by changing the set value, it is possible to configure a noise reduction circuit 200 that reduces noise of an arbitrary pulse width. For example, by setting a set value of the match detection circuit 451 in a register that can be accessed from a CPU, it is possible to freely set each of a width for reducing noise on a high level side and a width for reducing noise on a low level side. It is to be noted that since the width for reducing noise on a high level side is counted by the first counter circuit 211 and the width for reducing noise on a low level side are counted by the first counter circuit 215, it is possible to set separate values for each of the pulse width for reducing noise on the high level side and the pulse width for reducing noise on the low level side. Configuration and operation are otherwise identical to the first exemplary embodiment.

Fourth Exemplary Embodiment

A fourth exemplary embodiment is an example in which a counter circuit 300C of the third exemplary embodiment is replaced by a counter circuit 300D that uses a shift register (counter circuit 300B). A block diagram for the counter circuit 300D is shown in FIG. 11. With regard to the counter circuit 300D of FIG. 11, a counter circuit 300A that uses a binary flip-flop of the third exemplary embodiment is substituted by the counter circuit 300B of the second exemplary embodiment that uses a shift register. Furthermore, a match detection circuit 451 of the third exemplary embodiment is substituted by a selection circuit 451A. Among respective stages of the shift register that is connected in series by output switching signals, the selection circuit 451A is a circuit that performs switching with regard to which stage output signal is outputted to a selector circuit 221. This function is identical to a match detection circuit 451 of the third exemplary embodiment, and it is possible to select a pulse width for reducing noise by an output switching signal set in advance. Configuration and operation are otherwise identical to the third exemplary embodiment.

It is to be noted that in the fourth exemplary embodiment, in a case where the selection circuit 451A selects Q output of a data flip-flop circuit of a previous stage (for example, 401-1 of the first stage) within the counter circuit 300B, even if an output signal outputted from the selection circuit 451A is set, an internal data flip-flop circuit of a later stage (for example, a final stage 401-n) continues to operate. However, since a state in which an output signal (HLS or LLS) is set does not change, viewed from the outside, if the output signal is set, this is the same as a stopping operation.

Furthermore, the output signal to the selection circuit 221 is returned to a clock signal of the shift register, and if the output signal (signal HLS or LLS) to the selector circuit 221 is set, it is possible to stop a clock signal CLKB of the shift register. If this is done, in a case of using the shift register circuit, it is possible to have low power consumption.

Fifth Exemplary Embodiment

A fifth exemplary embodiment is an example where a binary flip-flop circuit 301 of the first exemplary embodiment (refer to FIG. 4) is a one stage configuration, or a data flip-flop circuit 401 of the second exemplary embodiment is a one stage configuration. With regard to a circuit configuration, a first counter circuit 211 and a second counter circuit 215 of a noise reduction circuit 200 (refer to FIG. 2) of the first exemplary embodiment may be a one stage binary flip-flop circuit 301, or a one stage data flip-flop circuit 401. In particular, in a case where clock frequency given from outside is low, in order to reduce noise without delay with respect to a data input signal DIN, to be outputted as the data output signal DOUT, it is not possible to take a large number of clock counts for noise reduction of the noise reduction circuit 200. In this case, there is a problem as to whether or not there is a malfunction due to noise in synchronization with the clock signal, but as shown in the fifth exemplary embodiment, if a configuration of the first counter circuit 211 and the second counter circuit 215 is configured by the one stage binary flip-flop circuit 301, or the one stage data flip-flop circuit 401, there is no problem at all.

Figure 12:
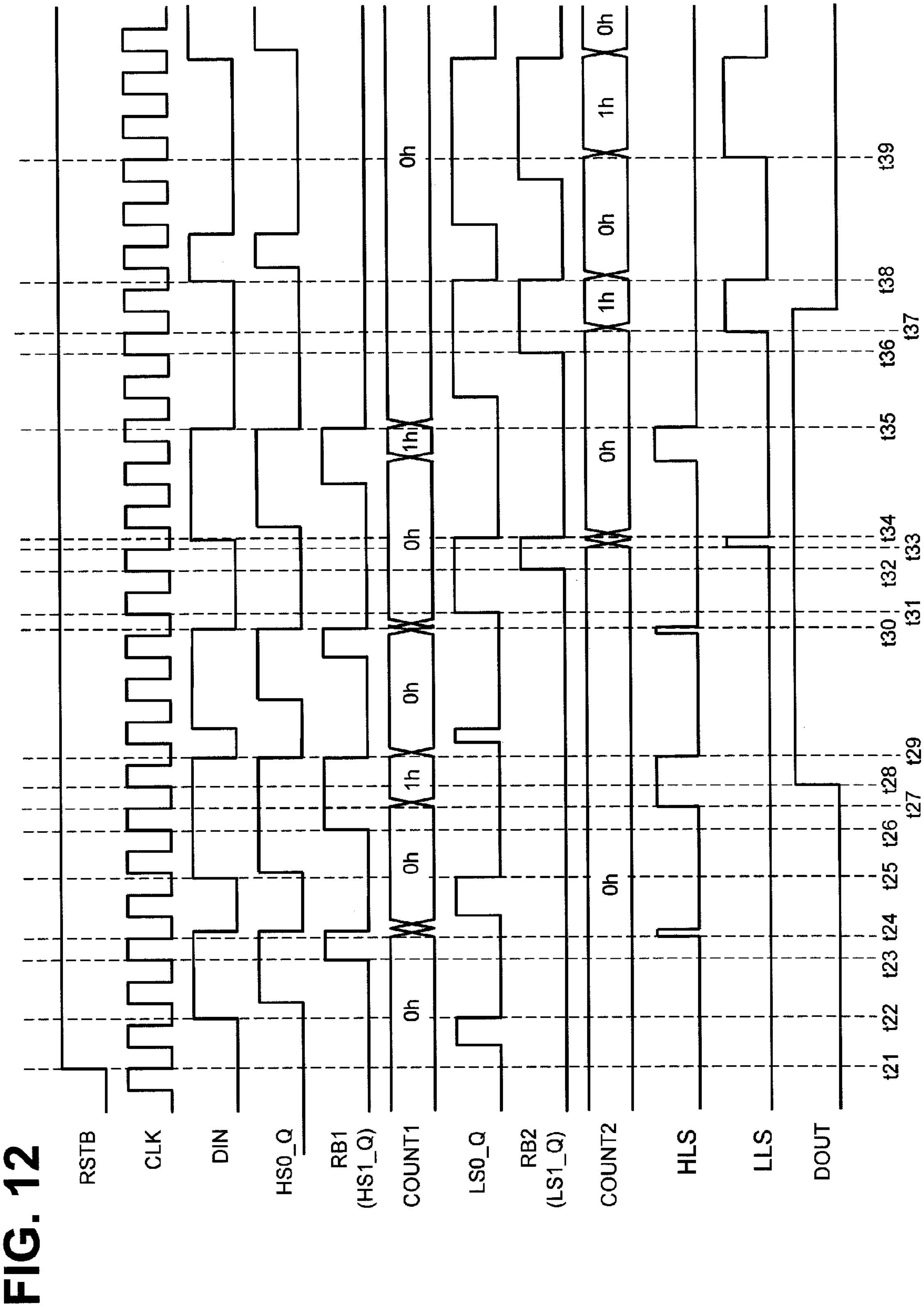
FIG. 12 is an operation timing diagram when a signal that is asynchronous with a clock is received in a fifth exemplary embodiment.

FIG. 12 is an operation timing diagram when a signal that is asynchronous with a clock CLK is received as input, as a data input signal DIN, in a case where a configuration of the first counter circuit 211 and the second counter circuit 215, with regard to the noise reduction circuit 200 of the first exemplary embodiment, are configured by the one stage binary flip-flop circuit 301, or the one stage data flip-flop circuit 401. It is to be noted that in a case where a configuration of the first counter circuit 211 and the second counter circuit 215 is configured by the binary flip-flop circuit 301, and a case of a configuration by the data flip-flop circuit 401, the operation timing diagram does not change at all.

In the operation timing diagram of FIG. 12, in an initial state an initialization signal RSTB is at a low level, and since it is activated, a first reset signal generation circuit 201, a second reset signal generation circuit 205, a first counter circuit 211, a second counter circuit 215, and an output flip-flop circuit 225 are all reset and initialized. Next, at timing t21 the initialization signal RSTB rises, and a reset state of the noise reduction circuit 200 is deactivated.

At timing t22, the data input signal DIN that is asynchronous with the clock CLK is rising. On receiving the data input signal DIN rise, the second reset signal generation circuit 205 is reset, and LSO_Q falls. Furthermore, since at the same time a reset signal (an output signal of an AND circuit 232) is deactivated with respect to the first reset signal generation circuit 201, HSO_Q rises at a subsequent clock signal CLK rise, and at timing t23 after an additional one period, the first reset signal RB1 rises, and resetting is deactivated with respect to the first counter circuit 211.

At timing t24, the first counter circuit 211 counts up in synchronization with a fall of the clock signal CLK, but since the first counter circuit is configured by a one stage flip-flop circuit, a high level set signal HLS, which is an output signal of the first counter circuit 211, rises from a low level to a high level. Since a selector circuit 221 switches selection input from the data output signal DOUT to a signal “H” that is fixed at a high level, according to a rise of the high level set signal HLS, the output signal of the selector circuit 221 also switches from a low level to a high level. However, since immediately thereafter the data input signal DIN is falling asynchronously with the clock signal CLK, the first reset signal generation circuit 201, and the first counter circuit 211 are reset, and the high level set signal HLS also falls to a low level. Therefore, the data output signal DOUT is maintained at a low level.

Next, at timing t25, the data input signal DOUT once again rises from a low level to a high level. Then, at a subsequent clock signal CLK rise, HSO Q rises, and after a further one period at timing t26, the first reset signal RB1 rises to a high level, and a reset state of the first counter circuit 211 is deactivated. At t27 after a further half period, when the clock signal CLK falls, the high level set signal HLS rises, and the data input signal of the output flip-flop circuit 225 also goes to a high level according to the selector circuit 221. Since the data input signal DIN is maintained at a high level until a subsequent clock signal CLK rise at timing t28, here the high level of the data input signal DIN is received by the noise reduction circuit 200 and output is made at a high level, as the data output signal DOUT. After a change of the data input signal DIN from a low level to a high level at timing t28 is received, even if the data input signal DIN at timing t29 falls, the level of the data output signal DOUT does not change immediately, but is maintained at a high level. The fall of the data output signal DOUT is at a half period after timing t37, and this is timing after two periods have elapsed, in synchronization with a rise of the clock signal CLK, from a data input signal DIN fall at timing t35.

That is, with continuity for at least two periods of the clock signal CLK in synchronization with a rise of the clock signal CLK, when the data input signal DIN is maintained at a high level or a low level, in the noise reduction circuit 200 of the fifth exemplary embodiment, a change of the data input signal DIN is received as not being noise, and is outputted as the data output signal DOUT. In a case of an unstable change in which a change of level of the data input signal DIN is of less than two periods in synchronization with a rise of the clock signal CLK, in the noise reduction circuit of the fifth exemplary embodiment, a determination of noise is made, the change of the data input signal DIN is not received, and the data output signal DOUT holds the previous logic level.

In the fifth exemplary embodiment, in a case where the data input signal DIN is asynchronous with the clock signal CLK, determination as to whether a change of level of the data input signal DIN is removed as noise, or is received as a regular logic level change, is done as follows.

(1) If a change of level to a high level or a low level of the data input signal DIN is maintained at a level that is continuous for at least 3 periods of the clock signal CLK, the change of level is received by the noise reduction circuit no matter at what timing the data input signal level changes at, and the level of the data output signal DOUT assuredly changes in response to the change in level of the data input signal DIN.

(2) In a case where a change of level to a high level or a low level of the data input signal DIN is only continuous for less than two periods of the clock signal CLK, the change of level is processed as noise no matter what timing the data input signal DIN level changes at, and the data output signal DOUT is maintained at the previous logic level.

(3) In a case where a continuous level change to a high level or a low level of the data input signal DIN is for at least two periods and less than three periods of the clock signal CLK, whether it is processed as noise or is received as a regular level change depends on phase of the clock signal CLK and timing at which the data input signal DIN changes.

As described above, according to the fifth exemplary embodiment, without frequency of the clock signal CLK being high, and irrespective of whether or not the data input signal DIN is in synchronization with the clock signal CLK, it is possible to reduce noise with good accuracy based on pulse width of an inputted signal from the data input signal DIN, and to output as the data output signal DOUT in synchronization with the clock signal CLK. In addition, since there is no necessity to generate a high frequency clock from a low frequency clock signal CLK using a PLL or another multiplier circuit, a low power consumption noise reduction circuit is obtained.

It is to be noted that in the noise reduction circuit in each of the exemplary embodiments, a signal width received as a change in the data input signal DIN and a signal width removed as noise are summarized as follows.

Case of Using a Binary Flip-flop Circuit for First and Second Counter Circuits

The number of stages of the binary flip-flop circuit is taken as n.

(1) If a change of level to a high level or a low level of the data input signal DIN is maintained at a level that is continuous for at least $2+2^{n-1}$ periods of the clock signal CLK, the change of level is received by the noise reduction circuit no matter what timing the data input signal level changes at, and the level of the data output signal DOUT assuredly changes in response to the change in level of the data input signal DIN.

(2) In a case where a change of level to a high level or a low level of the data input signal DIN is only continuous for less than $1+2^{n-1}$ periods of the clock signal CLK, the change of level is processed as noise no matter what timing the data input signal DIN level changes at, and the data output signal DOUT is maintained at the previous logic level.

(3) In a case where a continuous level change to a high level or a low level of the data input signal DIN is for at least $1+2^{n-1}$ periods and less than $2+2^{n-1}$ periods of the clock signal CLK, whether it is processed as noise or is received as a regular level change depends on phase of the clock signal CLK and timing at which the data input signal DIN changes.

Case of Using a Shift Register Circuit for First and Second Counter Circuits

The number of stages of the shift register circuit is taken as n.

(1) If a change of level to a high level or a low level of the data input signal DIN is maintained at a level that is continuous for at least 2+n periods of the clock signal CLK, the change of level is received by the noise reduction circuit no matter what timing the data input signal level changes at, and the level of the data output signal DOUT assuredly changes in response to the change in level of the data input signal DIN.

(2) In a case where a change of level to a high level or a low level of the data input signal DIN is only continuous for less than 1+n periods of the clock signal CLK, the change of level is processed as noise no matter what timing the data input signal DIN level changes at, and the data output signal DOUT is maintained at the previous logic level.

(3) In a case where a continuous level change to a high level or a low level of the data input signal DIN is for at least 1+n periods and less than 2+n periods of the clock signal CLK, whether it is processed as noise or is received as a regular level change, depends on phase of the clock signal CLK and timing at which the data input signal DIN changes.

As described above, in a case where it is necessary to remove as noise a signal that is continuous for a sufficiently long time, with respect to clock frequency, it is possible to have a small sized circuit using a counter circuit of the first exemplary embodiment or the third exemplary embodiment, where the first and second counter circuits use a binary flip-flop circuit. However, in a case where the signal width of the data input signal DIN to be removed as noise is not so large with respect to clock period, it is possible to use the counter circuits of the second or fourth exemplary embodiment that use the shift register circuit as the counter circuit.

It is to be noted that in the abovementioned exemplary embodiments, a description was given of examples using the noise reduction circuit at an input unit of an analog detection signal, but the noise reduction circuit according to the present invention can be widely used in noise reduction in a circuit that receives a data input signal in synchronization with a clock signal, irrespective of whether or not the data input signal is in synchronization with the clock. In particular, in a case where the clock frequency is low, the circuit is effective at assuredly reducing noise of a frequency higher than the clock frequency, such as noise in synchronization with the clock, without increasing power consumption.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A noise reduction circuit comprising:

a first reset signal generation circuit that generates a first reset signal that is activated when a data input signal goes to a low level, and is deactivated in synchronization with a clock signal when said data input signal is maintained at a high level;

a second reset signal generation circuit that generates a second reset signal that is activated when said data input signal goes to a high level, and is deactivated in synchronization with said clock signal when said data input signal is maintained at a low level;

a first counter circuit that counts an inverted signal of said clock signal, and is reset by said first reset signal;

a second counter circuit that counts an inverted signal of said clock signal, and is reset by said second reset signal; and a data output circuit that comprises a selector circuit and an output flip-flop circuit that outputs a signal selected by said selector circuit in synchronization with said clock signal, wherein said selector circuit selects and outputs any of: a signal fixed at a high level, a signal fixed at a low level, and the output signal of said output flip-flop circuit, according to logic levels of an output signal of said first counter circuit and an output signal of said second counter circuit.

2. The noise reduction circuit according to claim 1, wherein when the logic levels of the output signals of said first and second counter circuits are different, said selector circuit selects and outputs said signal fixed at a high level or said signal fixed at a low level according to logic levels, and wherein when the output signals of said first and second counter circuits are both at a reset level, said selector circuit selects and outputs the output signal of said output flip-flop circuit.

3. The noise reduction circuit according to claim 1, wherein said first counter circuit stops a count operation when the output signal of said first counter circuit is set, and wherein said second counter circuit stops a count operation when the output signal of said second counter circuit is set.

4. The noise reduction circuit according to claim 1, further comprising:

an initialization circuit that, when an initialization signal is received, resets said first and second reset signal generation circuits so as to output said first and second reset signals, and resets said output flip-flop circuit.

5. The noise reduction circuit according to claim 1, wherein each of said first and second counter circuits comprises a cascade-connected binary flip-flop circuit of at least one stage.

6. The noise reduction circuit according to claim 1, wherein each of said first and second counter circuits comprises a cascade-connected shift register circuit of at least one stage, wherein input of a first stage is connected to a set signal.

7. The noise reduction circuit according to claim 1, wherein a number of clock cycles of said clock signal, from when said first counter circuit is reset until the output signal of said first counter circuit is set, is programmable, and wherein a number of clock cycles of said clock signal, from when said second counter circuit is reset until the output signal of said second counter circuit is set, is programmable.

8. The noise reduction circuit according to claim 1, wherein each of said first and second counter circuits is a one stage counter circuit, wherein, when one inverted signal of said clock signal is counted, a corresponding output signal is set.

9. The noise reduction circuit according to claim 2, wherein said first counter circuit stops a count operation when the output signal of said first counter circuit is set, and wherein said second counter circuit stops a count operation when the output signal of said second counter circuit is set.

10. The noise reduction circuit according to claim 2, further comprising:

an initialization circuit that, when an initialization signal is received, resets said first and second reset signal generation circuits so as to output said first and second reset signals, and resets said output flip-flop circuit.

11. The noise reduction circuit according to claim 2, wherein each of said first and second counter circuits comprises a cascade-connected binary flip-flop circuit of at least one stage.

12. The noise reduction circuit according to claim 2, wherein each of said first and second counter circuits comprises a cascade-connected shift register circuit of at least one stage, wherein input of a first stage is connected to a set signal.

13. The noise reduction circuit according to claim 2, wherein a number of clock cycles of said clock signal, from when said first counter circuit is reset until the output signal of said first counter circuit is set, is programmable, and wherein a number of clock cycles of said clock signal, from when said second counter circuit is reset until the output signal of said second counter circuit is set, is programmable.

14. A semiconductor device comprising an analog unit that detects an analog signal and a control logic unit that controls said analog unit, formed on a semiconductor substrate, wherein:

said control logic unit comprises a noise reduction circuit at an input unit of an analog detection signal outputted by said analog unit, said noise reduction circuit including:

a first reset signal generation circuit that generates a first reset signal that is activated when a data input signal goes to a low level, and is deactivated in synchronization with a clock signal when said data input signal is maintained at a high level;

a second reset signal generation circuit that generates a second reset signal that is activated when said data input signal goes to a high level, and is deactivated in synchronization with said clock signal when said data input signal is maintained at a low level;

a first counter circuit that counts an inverted signal of said clock signal, and is reset by said first reset signal;

a second counter circuit that counts an inverted signal of said clock signal, and is reset by said second reset signal; and a data output circuit that comprises a selector circuit and an output flip-flop circuit that outputs a signal selected by said selector circuit in synchronization with said clock signal, wherein said selector circuit selects and outputs any of: a signal fixed at a high level, a signal fixed at a low level, and the output signal of said output flip-flop circuit, according to logic levels of an output signal of said first counter circuit and an output signal of said second counter circuit.

15. The semiconductor device according to claim 14, wherein when the logic levels of the output signals of said first and second counter circuits are different, said selector circuit selects and outputs said signal fixed at a high level or said signal fixed at a low level according to logic levels, and wherein when the output signals of said first and second counter circuits are both at a reset level, said selector circuit selects and outputs the output signal of said output flip-flop circuit.

16. The semiconductor device according to claim 14, wherein said first counter circuit stops a count operation when the output signal of said first counter circuit is set, and wherein said second counter circuit stops a count operation when the output signal of said second counter circuit is set.

17. The semiconductor device according to claim 14, further comprising:

an initialization circuit that, when an initialization signal is received, resets said first and second reset signal generation circuits so as to output said first and second reset signals, and resets said output flip-flop circuit.

18. The semiconductor device according to claim 14, wherein each of said first and second counter circuits comprises a cascade-connected binary flip-flop circuit of at least one stage.

19. The semiconductor device according to claim 14, wherein each of said first and second counter circuits comprises a cascade-connected shift register circuit of at least one stage, wherein input of a first stage is connected to a set signal.

20. The semiconductor device according to claim 14, wherein a number of clock cycles of said clock signal, from when said first counter circuit is reset until the output signal of said first counter circuit is set, is programmable, and wherein a number of clock cycles of said clock signal, from when said second counter circuit is reset until the output signal of said second counter circuit is set, is programmable.

* * * * *